US012604568B2

(12) United States Patent
Chen et al.

(10) Patent No.: US 12,604,568 B2
(45) Date of Patent: Apr. 14, 2026

(54) LIGHT-EMITTING DEVICE

(71) Applicant: EPISTAR CORPORATION, Hsinchu (TW)

(72) Inventors: Chao-Hsing Chen, Hsinchu (TW); Yi-Hung Lin, Hsinchu (TW); Kuo-Ching Hung, Hsinchu (TW); Chi-Shiang Hsu, Hsinchu (TW)

(73) Assignee: Ennostar Corporation, Hsinchu City (TW)

(*) Notice: Subject to any disclaimer, the term of this patent is extended or adjusted under 35 U.S.C. 154(b) by 979 days.

(21) Appl. No.: 17/827,622

(22) Filed: May 27, 2022

(65) Prior Publication Data

US 2022/0384687 A1 Dec. 1, 2022

(30) Foreign Application Priority Data

May 28, 2021 (TW) ................................. 110119457

(51) Int. Cl.
H10H 20/831 (2025.01)
H01L 25/075 (2006.01)
(Continued)

(52) U.S. Cl.
CPC ...... H10H 20/8312 (2025.01); H10H 20/821 (2025.01); H10H 20/84 (2025.01);
(Continued)

(58) Field of Classification Search
CPC . H01L 2224/05109; H01L 2224/05111; H01L 2224/05124; H01L 2224/05139; H01L 2224/05144; H01L 2224/05155; H01L 2224/05166; H01L 2224/05169; H01L 2224/05171; H01L 2224/05624; H01L 2224/05639; H01L 2224/05644; H01L 2224/05655; H01L 2224/05666;
(Continued)

(56) References Cited

U.S. PATENT DOCUMENTS 10,903,407 B2 1/2021 Miki et al.
2020/0020739 A1* 1/2020 Chen .................... H10H 29/142

FOREIGN PATENT DOCUMENTS

TW 201935708 A 9/2019
TW 201946292 A 12/2019
(Continued)

*Primary Examiner* — Latanya N Crawford Eason
(74) *Attorney, Agent, or Firm* — Ditthavong, Steiner, & Mlotkowski

(57) ABSTRACT

A light-emitting device comprises a semiconductor stack comprising a first semiconductor layer and a second semiconductor layer, wherein in a top view, the semiconductor stack comprises an outer peripheral region and an inner region, the outer peripheral region exposes the first semiconductor layer, and the second semiconductor layer is disposed in the inner region; an outer insulated structure comprising an insulation layer and a protective layer, the insulation layer comprising a plurality of first insulation layer outer openings and a second insulation layer opening; a first electrode covering the plurality of first insulation layer outer openings; and a second electrode covering the second insulation layer opening, wherein the outer insulated structure comprises a total thickness gradually decreasing from the outer peripheral region to the inner region.

20 Claims, 9 Drawing Sheets

(51) Int. Cl.

| | |
|---|---|
| *H10H 20/821* | (2025.01) |
| *H10H 20/824* | (2025.01) |
| *H10H 20/825* | (2025.01) |
| *H10H 20/832* | (2025.01) |
| *H10H 20/833* | (2025.01) |
| *H10H 20/84* | (2025.01) |
| *H10H 20/857* | (2025.01) |
| *H01L 23/00* | (2006.01) |

(52) U.S. Cl.

CPC .......... *H01L 24/05* (2013.01); *H01L 25/0753* (2013.01); *H01L 2224/05109* (2013.01); *H01L 2224/05111* (2013.01); *H01L 2224/05124* (2013.01); *H01L 2224/05139* (2013.01); *H01L 2224/05144* (2013.01); *H01L 2224/05155* (2013.01); *H01L 2224/05166* (2013.01); *H01L 2224/05169* (2013.01); *H01L 2224/05171* (2013.01); *H01L 2224/05552* (2013.01); *H01L 2224/05558* (2013.01); *H01L 2224/05564* (2013.01); *H01L 2224/05624* (2013.01); *H01L 2224/05639* (2013.01); *H01L 2224/05644* (2013.01); *H01L 2224/05655* (2013.01); *H01L 2224/05666* (2013.01); *H01L 2224/05669* (2013.01); *H01L 2224/05671* (2013.01); *H01L 2224/05684* (2013.01); *H01L 2924/0132* (2013.01); *H10H 20/824* (2025.01); *H10H 20/825* (2025.01); *H10H 20/833* (2025.01); *H10H 20/835* (2025.01); *H10H 20/857* (2025.01)

(58) Field of Classification Search

CPC . H01L 2224/05669; H01L 2224/05671; H01L 2224/05684; H01L 24/05; H01L 2224/05564; H01L 25/0753; H10H 20/833; H10H 20/835; H10H 20/857; H10H 20/821; H10H 20/831; H10H 20/8314; H10H 20/8316; H10H 29/8321; H10H 29/832; H10H 20/83; H10H 20/818; H10H 20/819; H10H 20/82; H10H 20/84; H10H 20/841; H10H 29/8421; H10H 29/842; H10H 29/8325; H10H 29/8323; H10H 20/825; H10H 20/824; H10H 20/8312

See application file for complete search history.

(56) References Cited

FOREIGN PATENT DOCUMENTS

| | | | |
|---|---|---|---|
| TW | 202006978 | A | 2/2020 |
| TW | 202008615 | A | 2/2020 |
| TW | 202118083 | A | 5/2021 |

* cited by examiner

LIGHT-EMITTING DEVICE

TECHNICAL FIELD

The application relates to a light-emitting device, and more particularly, to a flip-chip light-emitting device comprising a plurality of electrode contact regions.

REFERENCE TO RELATED APPLICATION

This application claims the right of priority based on TW Application Serial No. 110119457, filed on May 28, 2021, and the content of which is hereby incorporated by references in its entirety.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed, and good photoelectric property, such as stable emission wavelength. Therefore, the light-emitting diodes are widely used in the household appliances, the equipment indicators, and the optoelectronic products.

SUMMARY OF THE APPLICATION

A light-emitting device comprises a semiconductor stack comprising a first semiconductor layer and a second semiconductor layer, wherein in a top view, the semiconductor stack comprises an outer peripheral region and an inner region, the outer peripheral region exposes the first semiconductor layer, and the second semiconductor layer is disposed on the inner region besides the outer peripheral region; an outer insulated structure comprising an insulation layer and a protective layer, the insulation layer comprising a plurality of first insulation layer outer openings and a second insulation layer opening; a first electrode covering the plurality of first insulation layer outer openings and contacting the first semiconductor layer through the plurality of first insulation layer outer openings; and a second electrode covering the second insulation layer opening, wherein the outer insulated structure comprises a total thickness gradually decreasing from the outer peripheral region to the inner region.

BRIEF DESCRIPTION OF THE DRAWINGS

FIG. 13 illustrates a schematic diagram of a light-emitting apparatus 3 in accordance with an embodiment of the present application.

DETAILED DESCRIPTION OF PREFERRED EMBODIMENTS

Figure 1:
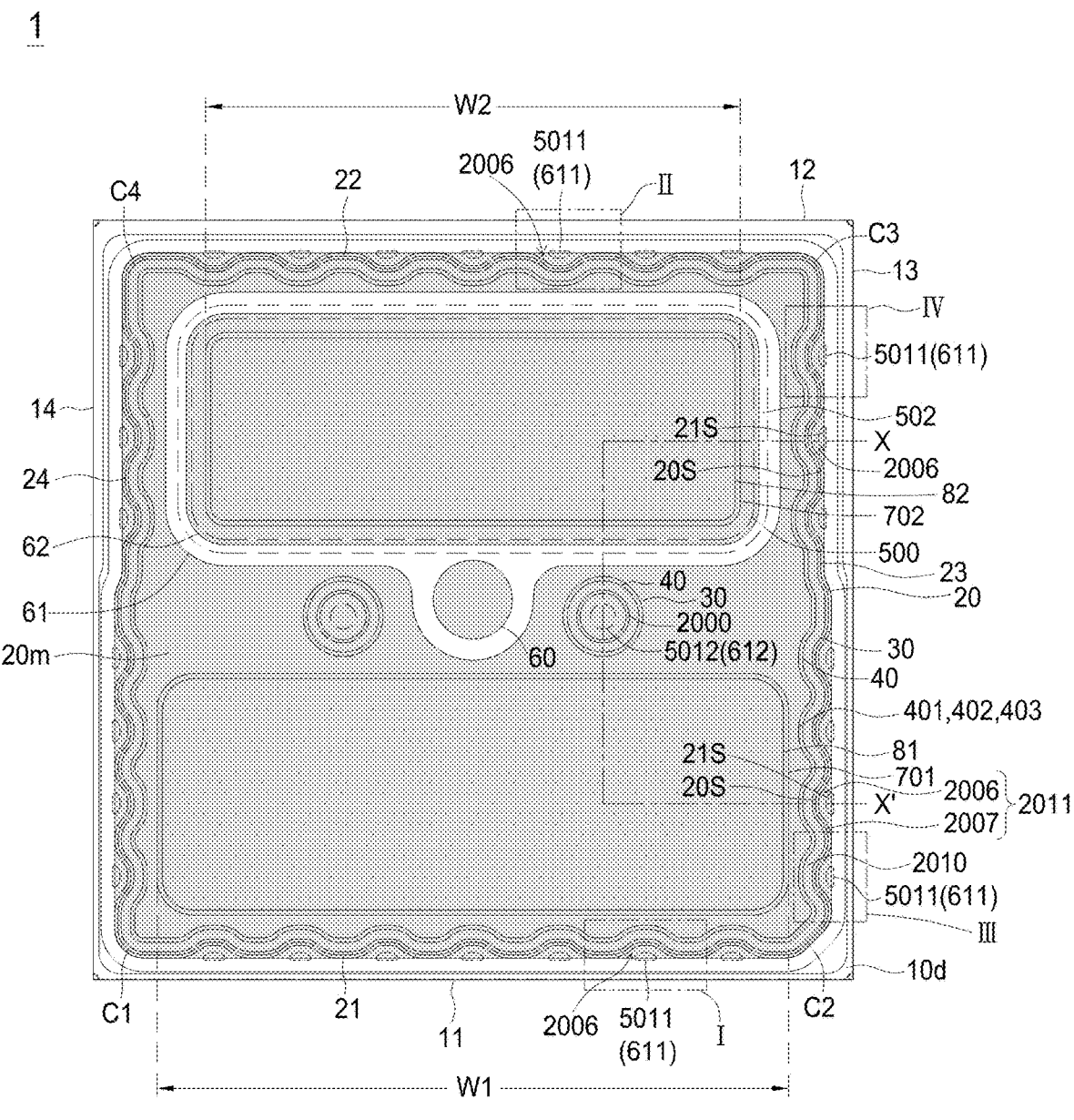
FIG. 1 illustrates a top view of a light-emitting device 1 in accordance with an embodiment of the present application.

The embodiment of the application is illustrated in detail, and is plotted in the drawings. The same or the similar part is illustrated in the drawings and the specification with the same number.

Figure 2:
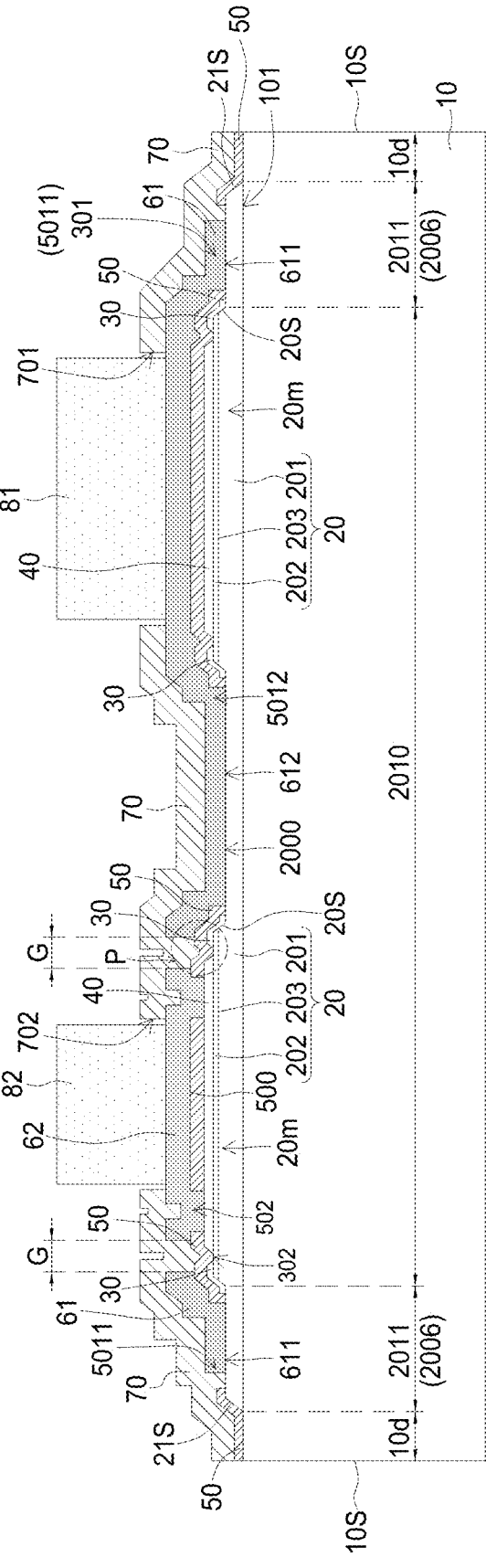
FIG. 2 illustrates a cross-sectional view of the light-emitting device 1 along the line X-X' of FIG. 1.

FIG. 1 illustrates a top view of a light-emitting device 1 in accordance with an embodiment of the present application. FIG. 2 illustrates a cross-sectional view of the light-emitting device 1 taken along the line X-X' of FIG. 1.

As shown in FIG. 1 and FIG. 2, the light-emitting device 1 comprises a substrate 10; and a semiconductor stack 20 disposed on the substrate 10, which comprises a first semiconductor layer 201, a second semiconductor layer 202, and an active layer 203 disposed between the first semiconductor layer 201 and the second semiconductor layer 202. In the top view and the side view of the light-emitting device 1, the semiconductor stack 20 comprises an outer peripheral region 2011 and an inner region 2010. The first semiconductor layer 201 is exposed in the outer peripheral region 2011, and the second semiconductor layer 202 and the active layer 203 are located in the inner region 2010 surrounded by the outer peripheral region 2011. An insulation layer 50 comprises a plurality of first insulation layer outer openings 5011 in the outer peripheral region 2011, a first insulation layer inner opening 5012 in the inner region 2010, and a second insulation layer opening 502 in the inner region 2010. A first electrode 61 covers the plurality of first insulation layer outer openings 5011 and contacts the first semiconductor layer 201 in the outer peripheral region 2011 through the plurality of first insulation layer outer openings 5011 to form a plurality of first electrode first contact regions 611. The first electrode 61 covers the first insulation layer inner opening 5012 and contacts the first semiconductor layer 201 in the inner region 2010 through the first insulation layer inner opening 5012 to form the first electrode second contact region 612. A second electrode 62 covers the second insulation layer opening 502 and is electrically connected to the second semiconductor layer 202 through the second insulation layer opening 502. A protective layer 70 covers the insulation layer 50, the first electrode 61, and the second electrode 62, wherein a portion of the insulation layer 50 and the protective layer 70 in contact with each other in the outer peripheral region 2011 comprises a total thickness gradually decreasing from the outer peripheral region 2011 to the inner region 2010.

The substrate 10 can be a growth substrate for the epitaxial growth of the semiconductor stack 20. The substrate 10 comprises gallium arsenide (GaAs) wafer for epitaxially growing aluminum gallium indium phosphide (AlGaInP), or sapphire (Al$_2$O$_3$) wafer, gallium nitride (GaN) wafer, silicon carbide (SiC) wafer, or aluminum nitride (AlN) wafer for epitaxially growing gallium nitride (GaN), indium gallium nitride (InGaN), or aluminum gallium nitride (AlGaN).

Figure 3A:
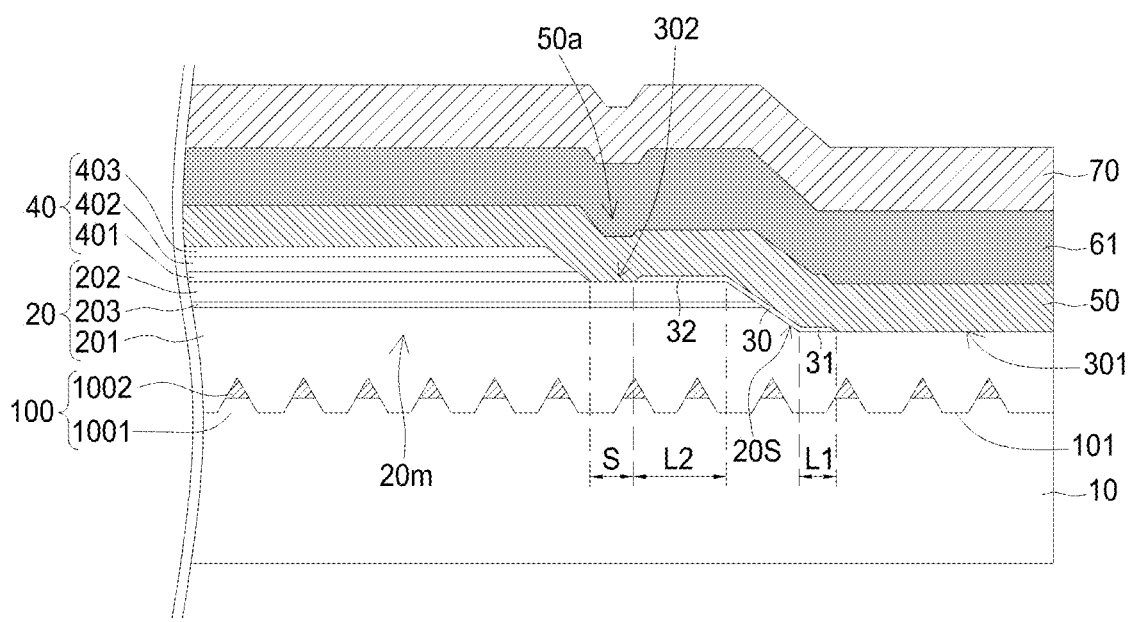
FIG. 3A illustrates a partial cross-sectional view of the light-emitting device 1 and an enlarged view of the region P indicated by the broken line of FIG. 2 in accordance with an embodiment of the present application.

FIG. 3A illustrates a partial cross-sectional view of the light-emitting device 1 and an enlarged view of the region P indicated by the broken line of FIG. 2 in accordance with an embodiment of the present application. A surface of the substrate 10 in contact with the semiconductor stack 20 can be a roughened surface. The roughened surface comprises a surface with an irregular morphology or a surface with a regular morphology. For example, with respect to the upper surface 101 of the substrate 10, the substrate 10 comprises one or more convex portions 100 protruding from the upper surface 101, or comprises one or more concave portions (not shown) recessed in the upper surface 101. In the cross-sectional view, the convex portion 100 or the concave portion (not shown) comprises a semicircular shape or a polygonal shape.

Each of the plurality of convex portions 100 comprises a first layer 1001 and a second layer 1002. The first layer 1001 comprises the same material as the substrate 10, such as gallium arsenide (GaAs), sapphire (Al$_2$O$_3$), gallium nitride (GaN), silicon carbide (SiC), or aluminum nitride (AlN). The second layer 1002 comprises a material different from that of the first layer 1001 and the substrate 10. The material of the second layer 1002 comprises insulating materials, such as silicon oxide, silicon nitride, or silicon oxynitride. In the side view of the light-emitting device 1, the convex portion 100 comprises a hemispherical shape, a cannonball shape, or a cone shape. The topmost end of the convex portion 100 can be a curved surface or a sharp point. In an embodiment of the present application, the convex portion 100 only comprises the second layer 1002 and lacks the first layer 1001, wherein a bottom surface of the second layer 1002 is flush with the upper surface 101 of the substrate 10.

In an embodiment of the present application, the metal organic chemical vapor deposition (MOCVD), molecular beam epitaxy (MBE), hydride vapor phase epitaxy (HVPE), physical vapor deposition (PVD), or ion plating method is provided to form the semiconductor stack 20 with photo-electrical characteristics on the substrate 10, such as a light-emitting stack, wherein the physical vapor deposition method comprises sputtering or evaporation.

The semiconductor stack 20 comprises the first semiconductor layer 201, the second semiconductor layer 202, and the active layer 203 formed between the first semiconductor layer 201 and the second semiconductor layer 202. The wavelength of the light emitted from the light-emitting device 1 is adjusted by changing the physical and chemical composition of one or more layers in the semiconductor stack 20. The material of the semiconductor stack 20 comprises III-V group semiconductor materials, such as Al$_x$In$_y$Ga$_{(1-x-y)}$N or Al$_x$Ga$_y$In$_{(1-x-y)}$P, where 0≤x, y≤1; (x+y)≤1. When the material of the semiconductor stack 20 comprises AlGaInP series material, the red light having a wavelength between 610 nm and 650 nm can be emitted. When the material of the semiconductor stack 20 comprises InGaN series material, the blue light having a wavelength between 400 nm and 490 nm or the green light having a wavelength between 530 nm and 570 nm can be emitted. When the material of the semiconductor stack 20 comprises AlGaN series or AlInGaN series material, the ultraviolet light having a wavelength between 250 nm and 400 nm can be emitted.

The first semiconductor layer 201 and the second semiconductor layer 202 can be cladding layers or confinement layers having different conductivity types, electrical properties, polarities, or doping elements for providing electrons or holes. For example, the first semiconductor layer 201 is an n-type semiconductor and the second semiconductor layer 202 is a p-type semiconductor. The active layer 203 is formed between the first semiconductor layer 201 and the second semiconductor layer 202. The electrons and the holes combine in the active layer 203 under a current driving to convert the electrical energy into the light energy and then the light is emitted from the active layer 203. The active layer 203 can be a single heterostructure (SH), a double heterostructure (DH), a double-side double heterostructure (DDH), or a multi-quantum well structure (MQW). The material of the active layer 203 can be i-type, p-type, or n-type semiconductor. The first semiconductor layer 201, the second semiconductor layer 202, or the active layer 203 can be a single layer or a structure comprising a plurality of sub-layers.

In an embodiment of the present application, the semiconductor stack 20 further comprises a buffer layer (not shown) formed between the first semiconductor layer 201 and the substrate 10 which can release the stress caused by lattice mismatch between the materials of the substrate 10 and the semiconductor stack 20 so the lattice dislocation and the lattice defect are reduced and the epitaxial quality of the semiconductor stack 20 is improved. The buffer layer comprises a single layer or a structure comprising a plurality of sub-layers. In an embodiment, an aluminum nitride (AlN) layer formed by PVD method can be the buffer layer located between the semiconductor stack 20 and the substrate 10 to improve the epitaxial quality of the semiconductor stack 20. In an embodiment, when the method for forming aluminum nitride (AlN) is PVD, the target can be made of aluminum nitride. In another embodiment, a target made of aluminum reacts with a nitrogen source to form the aluminum nitride.

In an embodiment of the present application, as shown in FIG. 1 and FIG. 2, the light-emitting device 1 comprises a first electrode pad 81 and a second electrode pad 82 formed on the same side of the semiconductor stack 20 to form a flip chip structure or a lateral chip structure.

As shown in FIG. 1, in the top view of the light-emitting device 1, the semiconductor stack 20 is substantially rectangular in the plan view, comprises four corners and four sidewalls. The four sidewalls comprise straight lines, square corrugations, wavy patterns, or a combination of any two of the above. The four sidewalls of the semiconductor stack 20 comprise a first sidewall 21, a second sidewall 22 opposite to the first sidewall 21, a third sidewall 23, and a fourth sidewall 24 opposite to the third sidewall 23. The four corners comprise arcs or straight lines. The four corners of the semiconductor stack 20 comprise a first corner C1, a second corner C2, a third corner C3, and a fourth corner C4.

In the present embodiment, the semiconductor stack 20 is patterned by the etching process, a part of the second semiconductor layer 202 and the active layer 203 are removed to expose the first semiconductor layer 201 and form an outer peripheral region 2011 and an inner region 2010 surrounded by the outer peripheral region 2011. The inner region 2010 comprises one or a plurality of semiconductor mesas 20m and one or a plurality of vias 2000. In the top view of the light-emitting device 1, as shown in FIG. 1, the outer peripheral region 2011 comprises a plurality of recessed portions 2006 and two adjacent recessed portions 2006 are separated by a protruding portion 2007. The recessed portion 2006 is not provided with the second semiconductor layer 202 and the active layer 203, and the recessed portion 2006 exposes the first semiconductor layer 201. The protruding portion 2007 comprises the first semiconductor layer 201, the second semiconductor layer 202, and the active layer 203. Compared with the recessed portion 2006, a top view of the protruding portion 2007 comprises an arc or a rectangle shape. In the embodiment, a plurality of first insulation layer outer openings 5011 comprising a semicircle shape are formed on each of the side-walls 21~24 of the light-emitting stack 20 and comprises the same size. The top view shape of the first insulation layer outer openings 5011 comprises a semicircle, a triangle, a trapezoid, or a rectangle. The size and shape of the first insulation layer outer opening 5011 are not limited to these. In addition, the first insulation layer outer opening 5011 with different sizes or shapes can also be provided.

A first space between the plurality of first insulation layer outer openings 5011 adjacent to the first sidewall 21 is the same as a second space between the plurality of first insulation layer outer openings 5011 adjacent to the second sidewall 22. However, the first space between the plurality of first insulation layer outer openings 5011 adjacent to the first sidewall 21 is different from a third space between the plurality of first insulation layer outer openings 5011 adjacent to the third sidewall 23.

Accordingly, the second semiconductor layer 202 and the active layer 203 each comprises an upper surface area smaller than that of the first semiconductor layer 201. The semiconductor mesa 20m is located on the first semiconductor layer 201 and comprises the second semiconductor layer 202 and the active layer 203. The recessed portion 2006 and the via 2000 expose the first semiconductor layer 201. A plurality of vias 2000 is formed in the inner region 2010 and arranged in a straight line or an array with a fixed or a varied distance from each other.

In the top view or the side view of the light-emitting device 1, the via 2000 comprises a width between 5 μm and 20 μm, more preferably between 8 μm and 15 μm. The top view shape of the via 2000 comprises a circle, an ellipse, a semicircle, a rectangle, or a long strip.

One of the plurality of vias 2000 is separated from a first side 11 of the light-emitting device 1 by a first shortest distance, and the same one of the plurality of vias 2000 described above is separated from a second side 12 of the light-emitting device 1 by a second shortest distance, the first side and the second side are opposite sides, and the first shortest distance is larger than or equal to the second shortest distance. The same one of the plurality of vias 2000 described above is separated from a third side 13 of the light-emitting device 1 by a third shortest distance, the third side 13 is orthogonal to the first side 11, and the first shortest distance and/or the second shortest distance are larger than the third shortest distance.

The plurality of vias 2000 and the outer peripheral region 2011 are formed by removing parts of the second semiconductor layer 202 and the active layer 203 to expose the first semiconductor layer 201. The side surface 20S of the second semiconductor layer 202 and the active layer 203 exposed by etching is an inclined surface relative to the exposed first semiconductor layer 201, wherein the inclined surface comprises multiple slopes.

The first electrode 61 contacts the first semiconductor layer 201 through the plurality of vias 2000 disposed in the inner region 2010 and the recessed portion 2006 disposed in the outer peripheral region 2011, and is electrically connected to the first semiconductor layer 201. The second electrode 62 is formed on the second semiconductor layer 202 and is electrically connected to the second semiconductor layer 202 through a contact electrode 40.

Figure 3B:
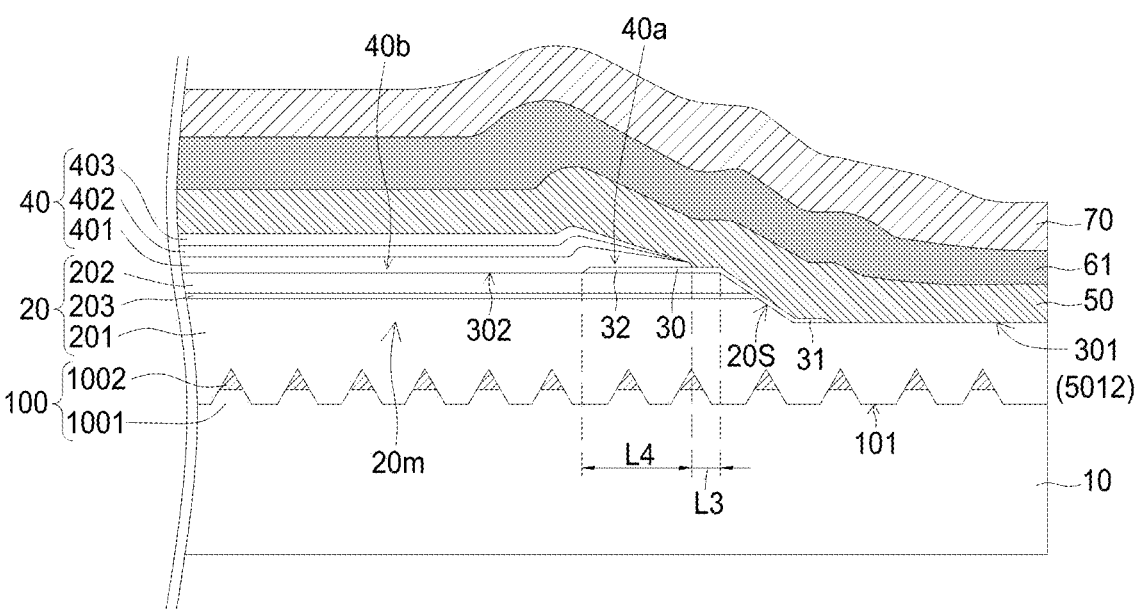
FIG. 3B illustrates a partial cross-sectional view of the light-emitting device 1 and an enlarged view of the region P indicated by the broken line of FIG. 2 in accordance with another embodiment of the present application.

FIG. 3A illustrates a partial cross-sectional view of the light-emitting device 1 and an enlarged view of a region P indicated by a broken line of FIG. 2 in accordance with an embodiment of the present application. FIG. 3B illustrates a partial cross-sectional view of the light-emitting device 1 and an enlarged view of the region P indicated by the broken line of FIG. 2 in accordance with another embodiment of the present application.

A passivation layer 30 covers the semiconductor mesa 20m, and comprises one or a plurality of first passivation layer openings 301 and one or a plurality of second passivation layer openings 302. In the top view of the light-emitting device 1, the first passivation layer openings 301 are disposed on the via 2000 and the recessed portion 2006 to expose the first semiconductor layer 201. The second passivation layer opening 302 is disposed on the semiconductor mesa 20m to expose the second semiconductor layer 202. As shown in FIGS. 3A and 3B, the passivation layer 30 comprises a first passivation layer portion 31 contacting the first semiconductor layer 201 and a second passivation layer portion 32 contacting the second semiconductor layer 202. The first passivation layer portion 31 comprises a first length L1 between 5 μm and 10 μm. The second passivation layer portion 32 comprises a second length L2 between 13 μm and 16 μm. In an embodiment, the first length L1 is shorter than the second length L2. But, the application is not limited to the above, the first length L1 is longer than or equal to the second length L2 in another embodiment.

The contact electrode 40 is disposed on the second passivation layer opening 302 to contact the second semiconductor layer 202. The contact electrode 40 substantially covers the upper surface of the semiconductor mesa 20m. For example, the contact electrode 40 covers more than 80% area of the semiconductor mesa 20m, more preferably more than 90%. In an embodiment of the present application, the contact electrode 40 comprises one layer or multiple layers selected from a group consisted of a transparent conductive layer 401, a reflective layer 402, and a barrier layer 403.

The transparent conductive layer 401 can be disposed between the reflective layer 402 and the second semiconductor layer 202. In order to reduce the contact resistance and improve the current spreading efficiency, the transparent conductive layer 401 comprises a material that is transparent to the light emitted from the active layer 203, such as a transparent conductive oxide. The transparent conductive oxide comprises indium tin oxide (ITO) or indium zinc oxide (IZO). In an embodiment of the present application, the transparent conductive layer 401 can be a metal layer with a thickness less than 500 angstroms.

The material of the reflective layer 402 comprises a reflective metal, such as aluminum (Al), silver (Ag), rhodium (Rh), platinum (Pt), or an alloy of the above materials. The reflective layer 402 is provided to reflect the light emitted from the active layer 203 and direct the reflected light toward the substrate 10 to be emitted outward.

As shown in FIG. 3B, the barrier layer 403 covers one side of the reflective layer 402 to prevent the reflective layer 402 from oxidizing and deteriorating its reflectivity. The material of the barrier layer 403 comprises metal materials, such as titanium (Ti), tungsten (W), aluminum (Al), indium (In), tin (Sn), nickel (Ni), chromium (Cr), platinum (Pt), or an alloy of the above materials. In the embodiment, as shown in FIG. 3A, the barrier layer 403 does not totally cover the reflective layer 402, and the side of the barrier layer 403 can be flush with the side of the reflective layer 402 or expose a portion of the upper surface or the side surface of the reflective layer 402.

The contact electrode 40 spreads the current supplied through the second electrode 62 to the second semiconductor layer 202. In addition, the contact electrode 40 comprises good light reflectivity and can be used as a layer that reflects the light emitted from the light-emitting device 1 to the light emission surface (i.e., one side of the substrate 10).

As shown in FIG. 3A, the contact electrode 40 does not contact the passivation layer 30, and a space S is located between the passivation layer 30 and the contact electrode 40. Part of the insulation layer 50 is located within the space S between the contact electrode 40 and the passivation layer 30, so that the top of the insulation layer 50 comprises an insulation recess 50a corresponding to the space S. In an embodiment, the insulation recess 50a comprises a depth substantially equal to or less than a thickness of the thickness of the passivation layer 30.

As shown in FIG. 3B, the contact electrode 40 comprises a first contact portion 40a covering the passivation layer 30 and a second contact portion 40b directly contacting the second semiconductor layer 202. The first contact portion 40a of the contact electrode 40 comprises a varied thickness along the top surface of the second semiconductor layer 202, and/or the second contact portion 40b of the contact electrode 40 comprises a constant thickness along the top surface of the second semiconductor layer 202 (i.e., less than 10% thickness deviation). Specifically, the first contact portion 40a of the contact electrode 40 comprises a thickness smaller than that of the second contact portion 40b and the thickness of the first contact portion 40a gradually decreases from the inner side to the outer side of the semiconductor mesa 20m. The thickness is measured in a direction perpendicular to the upper surface of the second semiconductor layer 202. The third length L3 between the edge of the first contact portion 40a and the side surface 20S of the semiconductor mesa 20m can be less than the fourth length L4 of the first contact portion 40a covering the passivation layer 30 to increase the electrode adhesion and increase the reflection area. In consideration of process variation, the third length L3 between the edge of the first contact portion 40a and the side surface 20S of the semiconductor mesa 20m can be larger than the fourth length L4 of the first contact portion 40a covering the passivation layer 30. In the embodiment, the third length L3 can be between 0 μm and 8 μm, and more preferably between 0 μm and 3 μm. The fourth length L4 can be between 5 μm and 18 μm, and more preferably between 10 μm and 13 μm.

The insulation layer 50 covers the semiconductor mesa 20m, and comprises one or a plurality of first insulation layer outer openings 5011, a first insulation layer inner opening 5012, and a second insulation layer opening 502. In the top view of the light-emitting device 1, the first insulation layer outer opening 5011 is disposed on the recessed portion 2006 to expose the first semiconductor layer 201. The first insulation layer inner opening 5012 is disposed on the via 2000 to correspond to the position of the via 2000 and expose the first semiconductor layer 201. The second insulation layer opening 502 is disposed on the contact electrode 40 to expose one or multiple layers of the transparent conductive layer 401, the reflective layer 402, and/or the barrier layer 403 of the contact electrode 40. The plurality of first insulation layer outer openings 5011 provided in the outer peripheral region 2011 is arranged in sequence along the directions of the four sides of the light-emitting device 1. The insulation layer 50 of the light-emitting device 1 covers the four corners of the semiconductor stack 20.

In an embodiment of the application, as shown in FIG. 2, the insulation layer 50 comprises an insulation layer platform 500 located under the second electrode 62 and the second electrode pad 82. In the top view of the light-emitting device 1, as shown in FIG. 1, the insulation layer platform 500 is surrounded by the second insulation layer opening 502. The insulation layer platform 500 can be formed inside or outside a projected area of the second electrode pad 82. In the side view of the light-emitting device 1, the insulation layer platform 500 is covered by the second electrode 62.

The first electrode 61 covers the plurality of first insulation layer outer openings 5011 and the first insulation layer inner opening 5012 of the insulation layer 50 and contacts the first semiconductor layer 201. The second electrode 62 covers the second insulation layer opening 502 of the insulation layer 50, and contacts the second semiconductor layer 202 and/or the contact electrode 40. In the top view of the light-emitting device 1, the second electrode 62, the insulation layer platform 500, and the second insulation layer opening 502 comprise the same shape. In an embodiment, the second electrode 62 and the second insulation layer opening 502 comprise a rectangular shape. In an embodiment, the second electrode 62 can be formed larger than the second insulation layer opening 502. The first electrode 61 and the second electrode 62 are spaced apart by the insulation layer 50. There is a gap G between the first electrode 61 and the second electrode 62, which is located on the semiconductor mesa 20m and exposes the insulation layer 50. The gap G is between 3 μm and 30 μm, preferably between 5 μm and 25 μm, more preferably between 18 μm between 22 μm.

As shown in FIG. 1 and FIG. 2, the first electrode 61 covers the plurality of first insulation layer inner openings 5012 and contacts the first semiconductor layer 201 through the plurality of first insulation layer inner openings 5012 to form a plurality of first electrode second contact regions 612. The first electrode 61 covers the plurality of first insulation layer outer openings 5011 and contacts the first semiconductor layer 201 in the outer peripheral region 2011 through the plurality of first insulation layer outer openings 5011 to form a plurality of first electrode first contact regions 611. Each of the plurality of first electrode first contact regions 611 comprises a first contact area smaller than a second contact area of each of the plurality of first electrode second contact regions 612. The plurality of first electrode first contact regions 611 comprises a total of the first contact areas larger than a total of the second contact areas of the plurality of first electrode second contact regions 612.

In the embodiment, the plurality of first electrode first contact regions 611 is provided in the outer peripheral region 2011 to reduce the total of the second contact areas of the first electrode second contact regions 612 in the inner region 2010, that can suppress the increase of forward voltage Vf, and provide a larger light-emitting area.

In the plan view of the light-emitting device 1, the plurality of first electrode first contact regions 611 is formed in regions other than the four corners, and the plurality of first electrode first contact regions 611 is formed with equal or unequal intervals in the outer peripheral region 2011 to improve the current density distribution.

As shown in FIG. 1, the light-emitting device 1 comprises a pin area 60 located at the geometric center of the semiconductor stack 20. The pin area 60 is not in contact with the first electrode 61 and the second electrode 62, and is electrically insulated from the first electrode 61 and the second electrode 62. The pin region 60 can protect the epitaxial layers from being damaged by the pin during the subsequent processes, such as die separation or sorting, flipping, die testing, and packaging, wherein the pin is necessary in LED chips sorting and chip bonding process to smoothly detach the LED chips and the blue membrane.

The protective layer 70 comprises a first protective layer opening 701 located in the inner region 2010 and a second protective layer opening 702 located in the inner region 2010, and the first protective layer opening 701 comprises a first opening width W1 larger than a second opening width W2 of the second protective layer opening 702.

The light-emitting device 1 comprises a first electrode pad 81 and a second electrode pad 82. As shown in FIG. 1, the first electrode pad 81 is adjacent to the first sidewall 21 of the semiconductor stack 20 and the second electrode pad 82 is adjacent to the second sidewall 22 of the semiconductor stack 20. A first distance between the first electrode pad 81 and the first sidewall 21 is smaller than a second distance between the second electrode pad 82 and the second sidewall 22.

As shown in FIG. 2, the first electrode pad 81 contacts the first electrode 61 through the first protective layer opening 701 and the second electrode pad 82 contacts the second electrode 62 through the second protective layer opening 702.

The first electrode pad 81 and the second electrode pad 82 comprise different conductivities. For example, the first electrode pad 81 can be an n-type electrode pad and the second electrode pad 82 can be a p-type electrode pad. The first electrode pad 81 and the second electrode pad 82 are located on the semiconductor mesa 20m, respectively located on the first protective layer opening 701 and the second protective layer opening 702 to contact the first electrode 61 and the second electrode 62, and are respectively electrically connected to the first semiconductor layer 201 and the second semiconductor layer 202.

The pin area 60, the first electrode 61, the second electrode 62, the first electrode pad 81, and the second electrode pad 82 comprise a metal material, such as chromium (Cr), titanium (Ti), tungsten (W), gold (Au), aluminum (Al), indium (In), tin (Sn), nickel (Ni), platinum (Pt), silver (Ag), or an alloy of the above materials. The pin area 60, the first electrode 61, the second electrode 62, the first electrode pad 81, and the second electrode pad 82 each comprises a single layer or multiple layers. For example, the pin region 60, the first electrode 61, the second electrode 62, the first electrode pad 81, or the second electrode pad 82 comprises Ti/Au layers, Ti/Pt/Au layers, Cr/Au layers, Cr/Pt/Au layers, Ni/Au layers, Ni/Pt/Au layers, Cr/Al/Cr/Ni/Au layers, or Ag/NiTi/TiW/Pt layers. The first electrode pad 81 and the second electrode pad 82 can provide an electrical path for an external power source to supply current to the first semiconductor layer 201 and the second semiconductor layer 202. The first electrode 61, the second electrode 62, the first electrode pad 81, and the second electrode pad 82 each comprises a thickness between 1 µm and 100 µm, preferably between 1.2 µm and 60 µm, more preferably between 1.5 µm and 6 µm.

The passivation layer 30, the insulation layer 50, and/or the protective layer 70 are provided on the semiconductor stack 20, and serve as protective films and antistatic insulating films between layers of the light-emitting device 1. As the insulating film, the passivation layer 30, the insulation layer 50, and/or the protective layer 70 comprises a single-layer structure comprising metal oxide or metal nitride while the metal can be selected from the group consisting of Si, Ti, Zr, Nb, Ta, and Al, for example. The passivation layer 30, the insulation layer 50, and/or the protective layer 70 can also comprise two or more materials with different refractive indices stacked alternately to form a Distributed Bragg Reflector (DBR) structure to selectively reflect light of a specific wavelength. For example, an insulating reflective structure with high reflectivity can be formed by stacking layers such as $SiO_2/TiO_2$ or $SiO_2/Nb_2O_5$. When $SiO_2/TiO_2$ or $SiO_2/Nb_2O_5$ forms a Distributed Bragg Reflector (DBR) structure, each layer of the Distributed Bragg Reflector (DBR) structure comprises an optical thickness of one or an integral multiple of a quarter of the wavelength of the light emitted from the active layer 203. The thickness of each layer of the Distributed Bragg Reflector (DBR) structure can have a deviation of ±30% on the basis of one or an integer multiple of 214. Since the thickness of each layer of the Distributed Bragg Reflector (DBR) structure affects the reflectivity, it is preferable to use E-beam evaporation to form the dielectric layer 30, the insulation layer 50, and/or the protective layer 70 to stably control the thickness of each layer of the Distributed Bragg Reflector (DBR) structure.

The light-emitting device 1 comprises a scribe line 10d located between a side 10S of the substrate 10 and a side 21S of the first semiconductor layer 201, and the scribe line 10d comprises a width between 5 µm and 50 µm, preferably less than 30 µm, more preferably less than 15 µm. The scribe line 10d exposes the upper surface 101 of the substrate 10 and is located around the light-emitting device 1 to surround the semiconductor stack 20.

Figure 4:
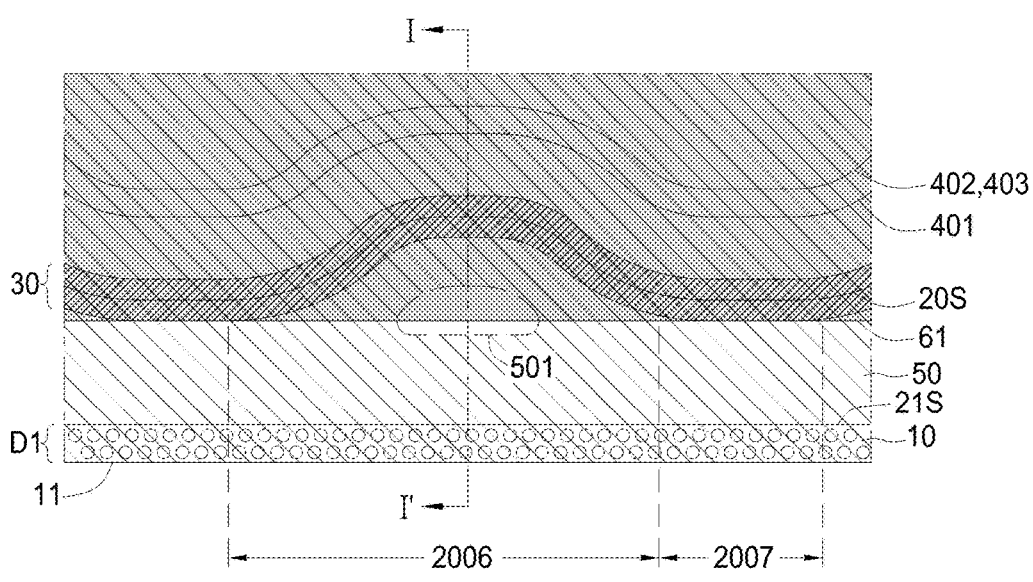
FIG. 4 illustrates an enlarged view of the region I indicated by the broken line of FIG. 1.
Figure 5:
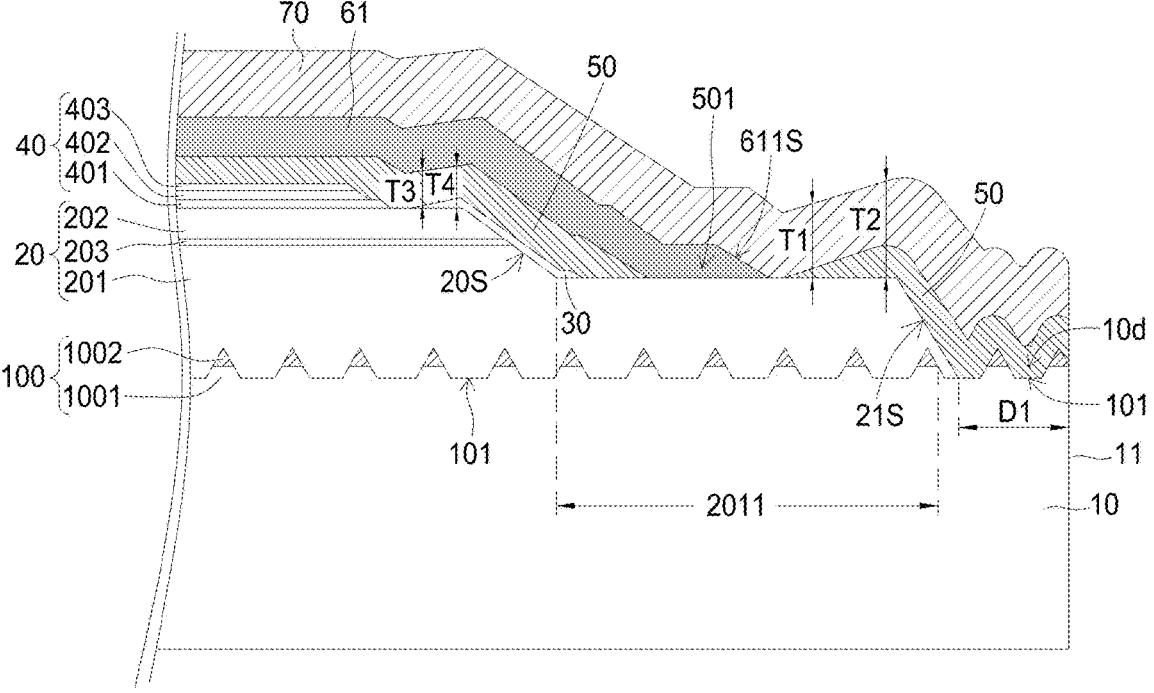
FIG. 5 illustrates a cross-sectional view taken along line I-I' of FIG. 4.
Figure 6:
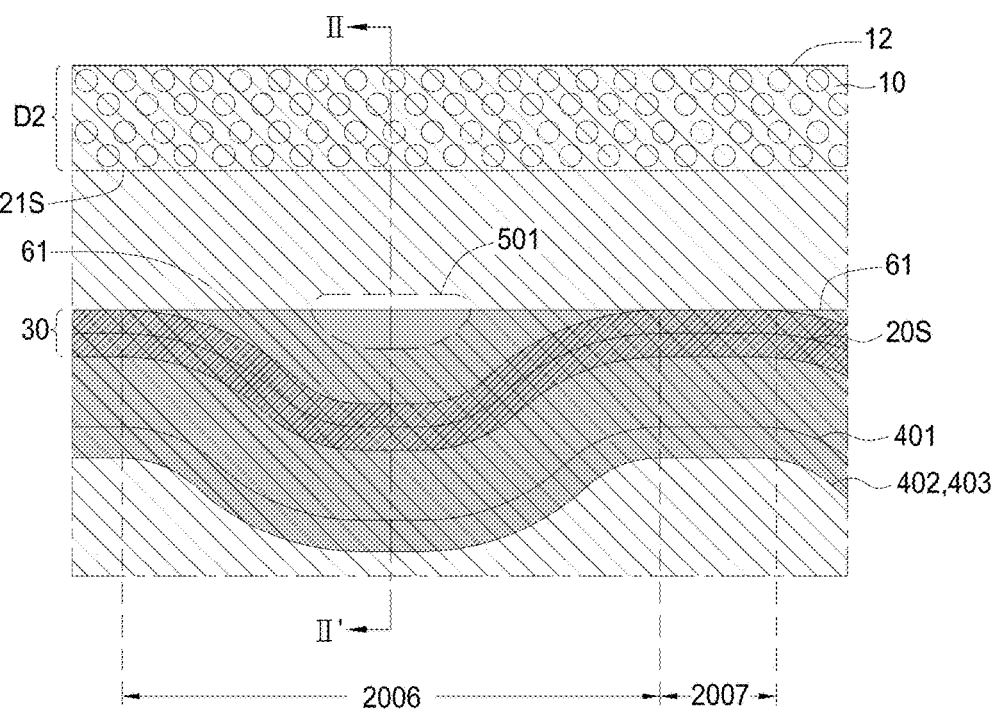
FIG. 6 illustrates an enlarged view of a region II indicated by the broken line of FIG. 1.
Figure 7:
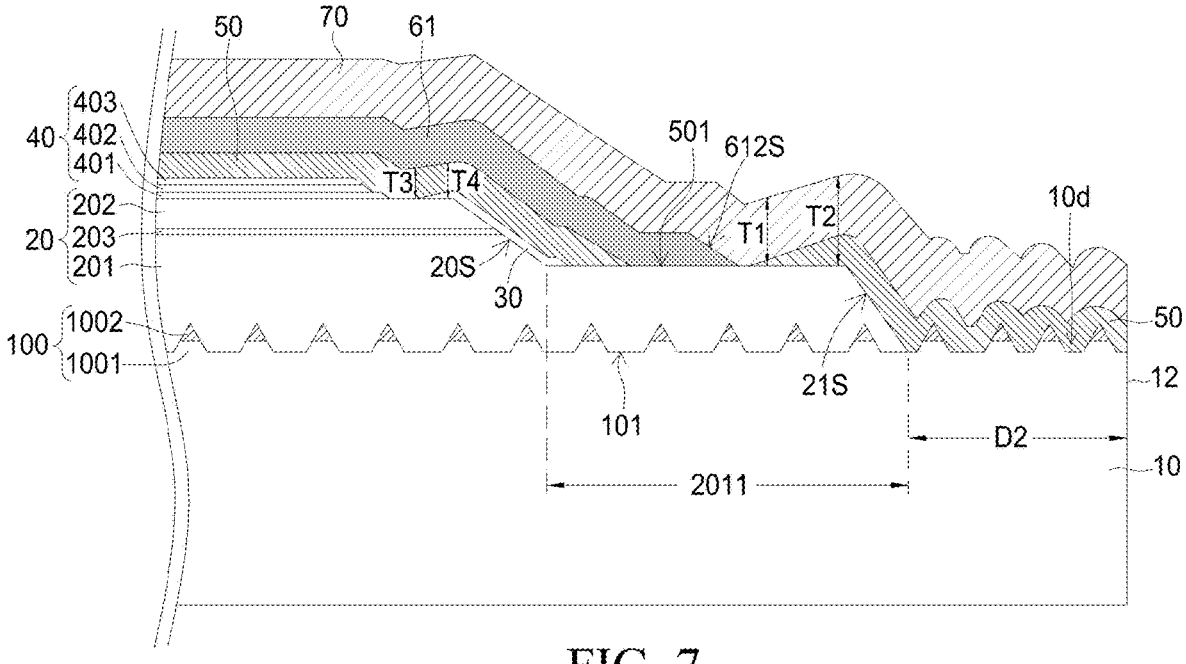
FIG. 7 illustrates a cross-sectional view taken along the line II-II' of FIG. 6.

FIG. 4 illustrates an enlarged view of the region I indicated by the broken line in FIG. 1. FIG. 5 illustrates a cross-sectional view taken along the line I-I' in FIG. 4. FIG. 6 illustrates an enlarged view of a region II indicated by a broken line in FIG. 1. FIG. 7 illustrates a cross-sectional view taken along the line II-II' of FIG. 6. As shown in FIGS. 4 and 5, in a direction parallel to the first side 11 or the second side 12 (not shown) of the light-emitting device 1, the protruding portion 2007 comprises a maximum width between 30 µm and 60 µm. The recessed portion 2006 comprises a maximum width between 30 µm and 60 µm.

The convex portions 100 on the exposed upper surface 101 of the substrate 10 can increase the light extraction of the light-emitting device 1 so it is necessary to protect the convex portions 100 from being damaged during the etching process, for example, covering the convent portions 100 by an outer insulated structure. In an embodiment of the present application, the outer insulated structure comprises a single layer or multi layers. The outer insulated structure has varied thickness along the top surface of the first semiconductor layer 201, such as a first thickness T1 and a second thickness T2 in the outer peripheral region 2011. The second thickness T2 and the first thickness T1 can be measured from the exposed top surface of the first semiconductor layer 201 to the top of the outer insulated structure along a direction perpendicular to the exposed top surface of the first semiconductor layer 201. The second thickness T2 measured at one position closer to the side 21S of the first semiconductor layer 201 is larger than the first thickness T1 measured at another position away from the side 21S of the first semiconductor layer 201.

The following illustrates an example of the outer insulated structure comprising the multi layers, but the same description is also applied to the example of the outer insulated structure comprising the single layer. In an embodiment, the outer insulated structure comprises the insulation layer 50 and the protective layer 70. The portion of the outer insulated structure where the insulation layer 50 and the protective layer 70 in contact with each other in the outer peripheral region 2011 has varied thickness along the top surface of the first semiconductor layer 201, such as a first thickness T1 and a second thickness T2. FIG. 5 illustrates an example that the second thickness T2 measured at one position closer to the side 21S of the first semiconductor layer 201 is larger than the first thickness T1 measured at another position away from the side 21S of the first semiconductor layer 201. The second thickness T2 and the first thickness T1 can be measured from the exposed top surface of the first semiconductor layer 201 to the top of the protective layer 70 along a direction perpendicular to the exposed top surface of the first semiconductor layer 201. In an embodiment of the application, the first thickness T1 is between 3 μm and 30 μm, and the second thickness T2 is between 6 μm and 60 μm. The above thickness is measured in a direction perpendicular to the upper surface of the second semiconductor layer 202.

The epitaxy quality of the active layer 203 is important for the light emitting efficiency of the light-emitting device 1 so it is necessary to protect the side surface 20S of the second semiconductor layer 202 and the active layer 203 from being damaged during the etching process, for example, covering the side surface 20S of the second semiconductor layer 202 and the active layer 203 by an inner insulated structure. In an embodiment of the present application, the inner insulated structure comprises a single layer or multi layers. The inner insulated structure has varied thickness along the top surface of the second semiconductor layer 202, such as a third thickness T3 and a fourth thickness T4. The third thickness T3 and the fourth thickness T4 can be measured from the top surface of the second semiconductor layer 202 to the top of the protective layer 70 along a direction perpendicular to the top surface of the second semiconductor layer 202. The fourth thickness T4 measured at one position closer to side surface 20S is larger than the third thickness T3 measured at another position away from the side surface 20S.

The following illustrates an example of the inner insulated structure comprising the multi layers, but the same description is also applied to the example of the inner insulated structure comprising the single layer. In an embodiment, the inner insulated structure comprises the passivation layer 30 and the insulation layer 50. The portion of the inner insulated structure where the passivation layer 30 and the insulation layer 50 in contact with each other on the semiconductor mesa 20m has varied thickness along the top surface of the second semiconductor layer 203, such as a third thickness T3 and a fourth thickness T4. FIG. 5 illustrates an example that the fourth thickness T4 measured at one position closer to side surface 20S is larger than the third thickness T3 measured at another position away from the side surface 20S. The third thickness T3 and the fourth thickness T4 can be measured from the top surface of the second semiconductor layer 202 to the top of the protective layer 70 along a direction perpendicular to the top surface of the second semiconductor layer 202. In an embodiment of the application, the third thickness T3 is between 3 μm and 30 μm, and the fourth thickness T4 is between 6 μm and 60 μm. The above thickness is measured in a direction perpendicular to the upper surface of the second semiconductor layer 202.

As shown in FIG. 5, the scribe line 10d adjacent to the first side 11 of the light-emitting device 1 comprises a first width D1. As shown in FIG. 7, the scribe line 10d adjacent to the second side 12 of the light-emitting device 1 comprises a second width D2. The first width D1 and the second width D2 can be the same or different. In the embodiment, the second width D2 is larger than the first width D1, and a ratio (D2/D1) between the second width D2 and the first width D1 is larger than 2 but less than 4.

Figure 8:
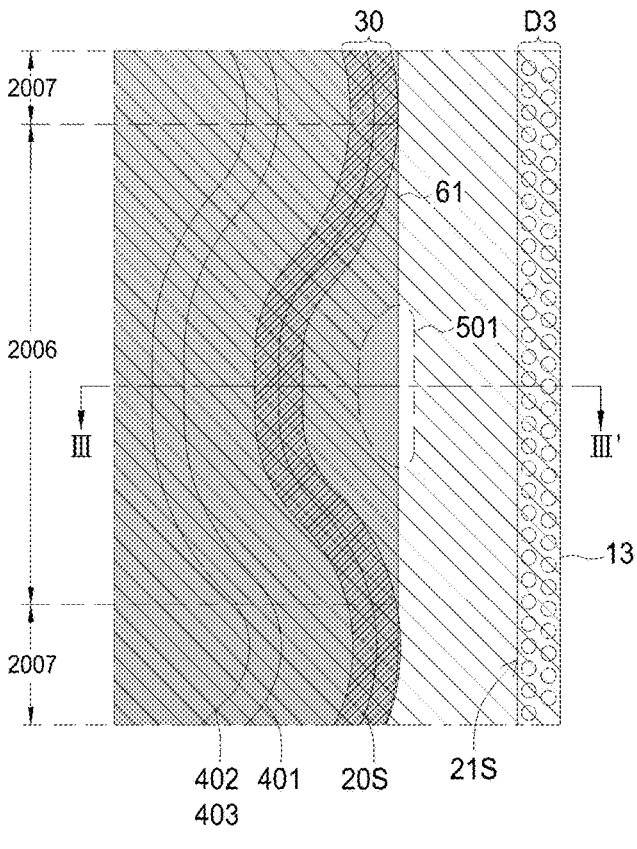
FIG. 8 illustrates an enlarged view of the region III indicated by the broken line of FIG. 1.
Figure 9:
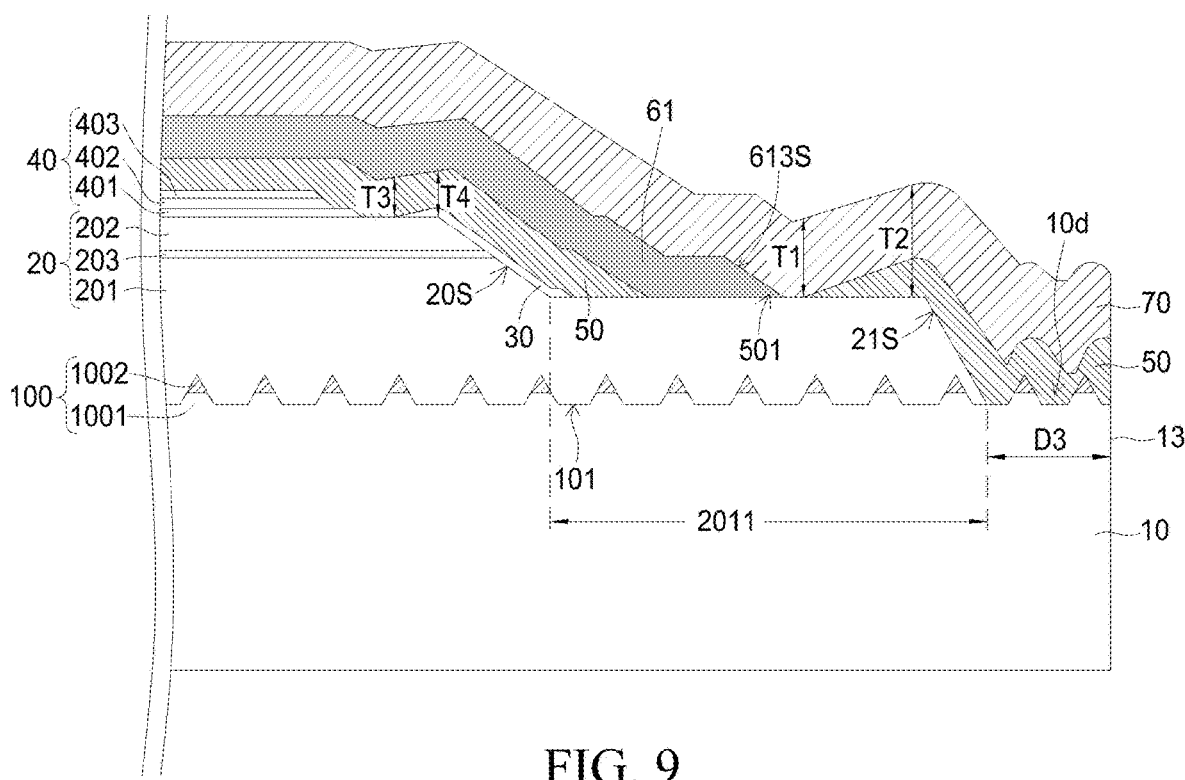
FIG. 9 illustrates a cross-sectional view taken along the line of FIG. 8.
Figure 10:
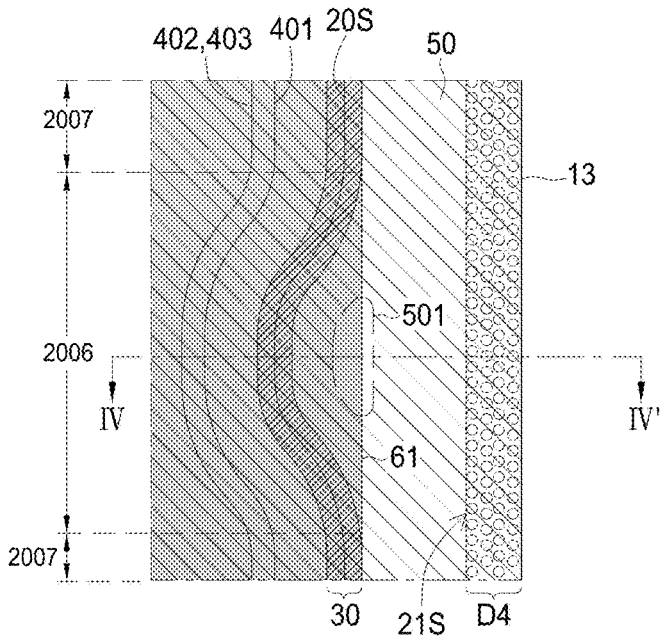
FIG. 10 illustrates an enlarged view of the region IV indicated by the broken line of FIG. 1.
Figure 11:
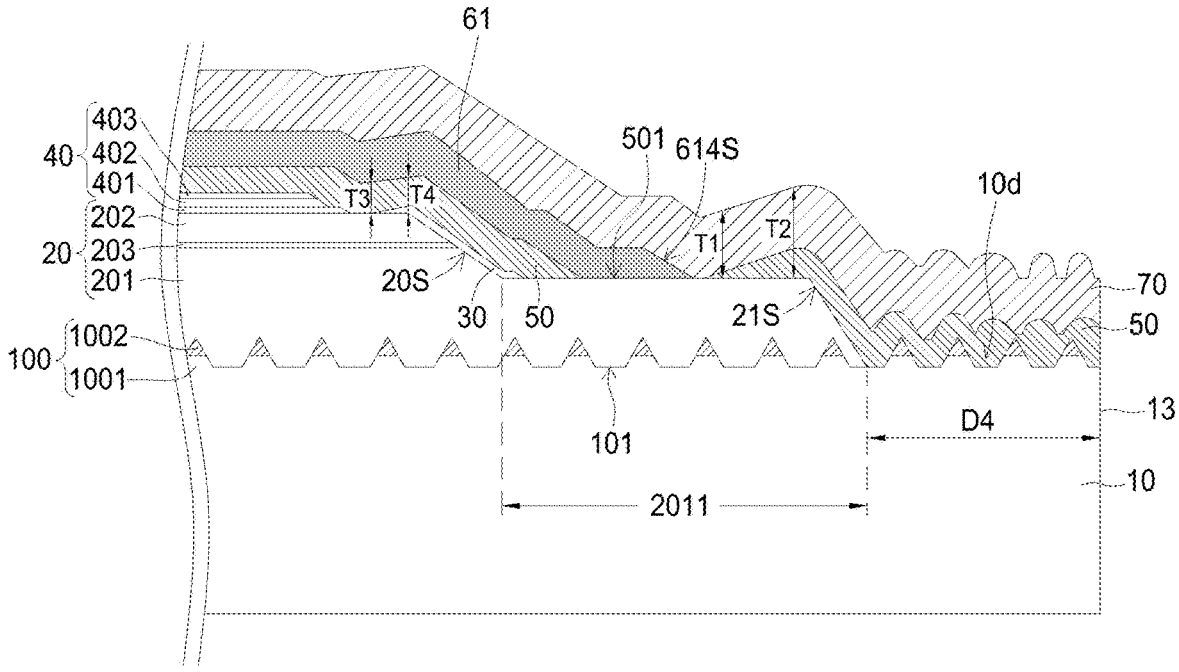
FIG. 11 illustrates a cross-sectional view taken along the line IV-IV' of FIG. 10.

FIG. 8 is an enlarged view of the region III indicated by the broken line in FIG. 1. FIG. 9 is a cross-sectional view taken along the line of FIG. 8. FIG. 10 is an enlarged view of the region IV indicated by the broken line in FIG. 1. FIG. 11 is a cross-sectional view taken along the line IV-IV' of FIG. 10. In a direction parallel to the third side 13 or the fourth side 14 of the light-emitting device 1, the protruding portion 2007 comprises a maximum width between 30 μm and 60 μm. The recessed portion 2006 comprises a maximum width between 30 μm and 60 μm.

As shown in FIG. 9, one portion of the scribe line 10d adjacent to the third side 13 or the fourth side 14 (not shown) of the light-emitting device 1 comprises a third width D3. As shown in FIG. 11, another portion of the scribe line 10d adjacent to the third side 13 or the fourth side 14 (not shown) of the light-emitting device 1 comprises a fourth width D4. The third width D3 is different from the fourth width D4. In other words, the scribe line 10d adjacent to the third side 13 or the fourth side 14 of the light-emitting device 1 comprises two or more widths, the fourth width D4 is larger than the third width D3, and the ratio (D4/D3) between the fourth width D4 and the third width D3 is larger than 2 but less than 4. In a direction parallel to the third side 13 or the fourth side 14 of the light-emitting device 1, the length of the one portion of the scribe line 10d having the third width D3 can be larger than, less than, or equal to the length of the another portion of the scribe line 10d having the fourth width D4. In order to retain more light-emitting area, the length of the one portion of the scribe line 10d with the third width D3 can be larger than the length of the another portion of the scribe line 10d with the fourth width D4.

As shown in FIG. 5 and FIG. 7, the first electrode 61 comprises a first electrode first side surface 611S adjacent to the first side 11 of the light-emitting device 1 and a first electrode second side surface 612S adjacent to second side 12 of the light-emitting device 1. The distance between the first electrode first side surface 611S and the first side 11 of the light-emitting device 1 is smaller than the distance between the first electrode second side surface 612S and the second side 12 of the light-emitting device 1.

As shown in FIG. 9 and FIG. 11, the first electrode 61 further comprises a first electrode third side surface 613S adjacent to the third side 13 of the light-emitting device 1 and the first side 11 of the light-emitting device 1, and a first electrode fourth side surface 614S adjacent to the third side 13 of the light-emitting device 1 and the second side 12 of the light-emitting device 1. The distance between the first electrode third side surface 613S and the third side 13 of the light-emitting device 1 is less than the distance between the first electrode fourth side surface 614S and the third side 13 of the light-emitting device 1.

Figure 12:
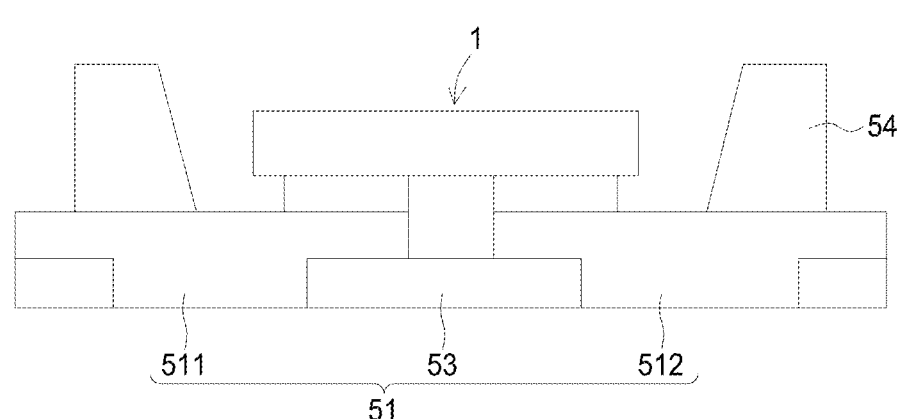
FIG. 12 illustrates a schematic diagram of a light-emitting apparatus 2 in accordance with an embodiment of the present application.

FIG. 12 is a schematic diagram of a light-emitting apparatus 2 in accordance with an embodiment of the present application. The light-emitting device 1 in the foregoing embodiment is mounted on the first spacer 511 and the second spacer 512 of the package substrate 51 in the form of flip-chip. The first spacer 511 and the second spacer 512 are electrically insulated from each other by an insulating portion 53 comprising an insulating material. The main light-extraction surface of the flip chip is one side of the growth substrate opposite to the electrode-forming surface where the electrodes are formed on. For example, the substrate 10 of the light-emitting device 1 is the main light extraction surface of the light-emitting device 1. A reflective structure 54 can be arranged around the light emitting element 1 to increase the light extraction efficiency of the light-emitting apparatus 2.

Figure 13:
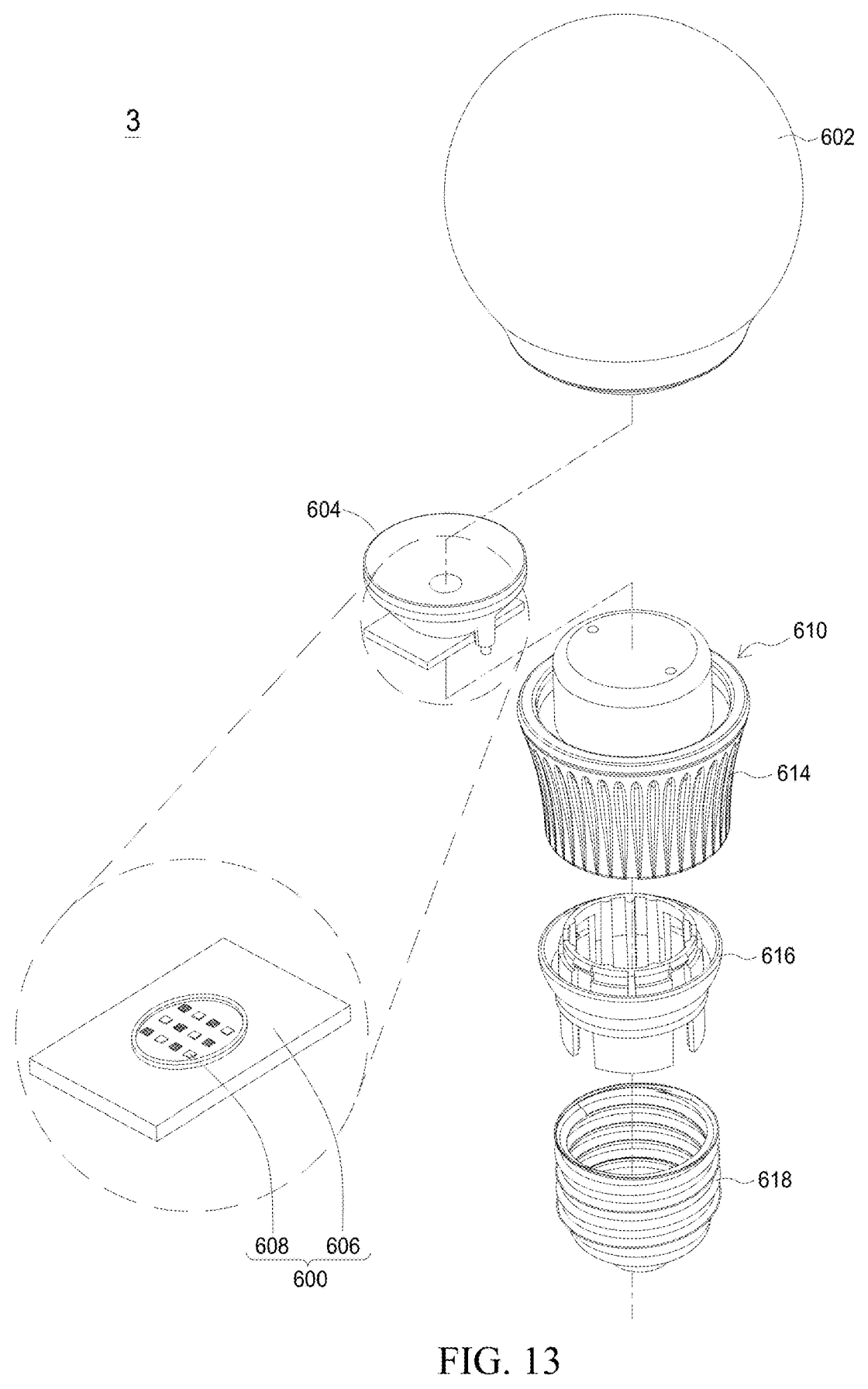

FIG. 13 is a schematic diagram of a light-emitting apparatus 3 according to an embodiment of the present application. The light-emitting apparatus 3 can be a bulb comprising an envelope 602, a lens 604, a light-emitting module 600, a base 610, a heat sink 614, a connector 616, and an electrical connecting element 618. The light-emitting module 600 comprises a submount 606 and a plurality of light-emitting devices 608 on the submount 606, wherein the plurality of light-emitting devices 608 can be the light-emitting device 1 or the light-emitting apparatus 2 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A semiconductor device, comprising: a semiconductor stack comprising a first semiconductor layer, an active layer, and a second semiconductor layer, wherein in a top view, the semiconductor stack comprises an outer peripheral region and an inner region surrounded by the outer peripheral region, the outer peripheral region exposes the first semiconductor layer, and the second semiconductor layer is disposed in the inner region; an outer insulated structure comprising a portion, the portion comprising an insulation layer and a protective layer, which have a total thickness gradually decreasing from the outer peripheral region to the inner region; a first electrode electrically connected to the first semiconductor layer; and a second electrode electrically connected to the second semiconductor layer.

2. The semiconductor device according to claim 1, further comprising a first insulation layer outer opening disposed in the outer peripheral region, and a second insulation layer opening disposed in the inner region.

3. The semiconductor device according to claim 1, further comprising a plurality of first insulation layer outer openings disposed in the outer peripheral region.

4. The semiconductor device according to claim 2, wherein the first electrode contacts the first semiconductor layer through the first insulation layer outer opening.

5. The semiconductor device according to claim 2, further comprising a via disposed in the inner region, wherein the via passes through the active layer and the second semiconductor layer to expose the first semiconductor layer.

6. The semiconductor device according to claim 5, further comprising a first insulation layer inner opening corresponding to the via, the first electrode contacts the first semiconductor layer through the first insulation layer inner opening.

7. The semiconductor device according to claim 2, further comprising a plurality of vias passing through the active layer and the second semiconductor layer to expose the first semiconductor layer.

8. The semiconductor device according to claim 2, wherein the second electrode is electrically connected to the second semiconductor layer through the second insulation layer opening.

9. The semiconductor device according to claim 1, wherein the protective layer comprises a first protective layer opening disposed in the inner region and a second protective layer opening disposed in the inner region.

10. The semiconductor device according to claim 9, wherein the first protective layer opening comprises a first opening width, and the second protective layer opening comprises a second opening width less than the first opening width.

11. The semiconductor device according to claim 9, further comprising:

a first electrode pad contacting the first electrode through the first protective layer opening; and a second electrode pad contacting the second electrode through the second protective layer opening.

12. The semiconductor device according to claim 11, wherein in the top view, the semiconductor stack comprises a first sidewall, a second sidewall opposite to the first sidewall, a third sidewall, a fourth sidewall opposite to the third sidewall, the first electrode pad is adjacent to the first sidewall, and the second electrode pad is adjacent to the second sidewall.

13. The semiconductor device according to claim 12, wherein a first distance between the first electrode pad and the first sidewall is smaller than a second distance between the second electrode pad and the second sidewall.

14. The semiconductor device according to claim 2, further comprising a passivation layer covering a portion of the first semiconductor layer and a portion of the second semiconductor layer.

15. The semiconductor device according to claim 14, further comprising a contact electrode formed on the second semiconductor layer, wherein the contact electrode comprises a first contact portion covering the passivation layer and a second contact portion contacting the second semiconductor layer.

16. The semiconductor device according to claim 15, wherein the first contact portion comprises a thickness smaller than that of the second contact portion.

17. The semiconductor device according to claim 14, wherein a third length L3 between an edge of the first contact portion and a side surface of the second semiconductor layer is less than a fourth length L4 of the first contact portion covering the passivation layer.

18. The semiconductor device according to claim 14, wherein the passivation layer comprises a first passivation layer portion contacting the first semiconductor layer and a second passivation layer portion contacting the second semiconductor layer.

19. The semiconductor device according to claim 18, wherein the first passivation layer portion comprises a first length between 5 μm and 10 μm.

20. The semiconductor device according to claim 18, wherein the second passivation layer portion comprises a second length L2 between 13 μm and 16 μm.

* * * * *